US012726173B2

(12) United States Patent
Nagatomo

(10) Patent No.: US 12,726,173 B2
(45) Date of Patent: Sep. 1, 2026

(54) ACOUSTIC WAVE DEVICE

(71) Applicant: Murata Manufacturing Co., Ltd., Nagaokakyo (JP)

(72) Inventor: Sho Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 679 days.

(21) Appl. No.: 18/213,288

(22) Filed: Jun. 23, 2023

(65) Prior Publication Data

US 2023/0336148 A1 Oct. 19, 2023

Related U.S. Application Data

(63) Continuation of application No. PCT/JP2022/000395, filed on Jan. 7, 2022.

(30) Foreign Application Priority Data

Jan. 13, 2021 (JP) ................................ 2021-003650

(51) Int. Cl.
*H03H 9/02* (2006.01)
*H03H 3/08* (2006.01)
(Continued)

(52) U.S. Cl.
CPC .......... *H03H 9/02866* (2013.01); *H03H 3/08* (2013.01); *H03H 9/02637* (2013.01); *H03H 9/145* (2013.01); *H03H 9/25* (2013.01)

(58) Field of Classification Search
CPC .. H03H 9/02866; H03H 3/08; H03H 9/02637; H03H 9/145; H03H 9/25; H03H 9/02818; H03H 9/02228; H03H 9/02574
See application file for complete search history.

(56) References Cited

U.S. PATENT DOCUMENTS 10,938,371 B2 * 3/2021 Nakamura ......... H03H 9/02858
2011/0068655 A1 3/2011 Solal et al.
(Continued)

FOREIGN PATENT DOCUMENTS

JP 2011101350 A 5/2011
JP 2014110457 A 6/2014
(Continued)

OTHER PUBLICATIONS

International Search Report in PCT/JP2022/000395, mailed Mar. 29, 2022, 3 pages.
(Continued)

*Primary Examiner* — Bumsuk Won
(74) *Attorney, Agent, or Firm* — Keating & Bennett, LLP

(57) ABSTRACT

An acoustic wave device includes a piezoelectric substrate including a support substrate and a piezoelectric layer, and an IDT electrode. In the IDT electrode, a second gap region includes gap portions on an extension line in an electrode finger extending direction. A through-hole is provided in a portion of the piezoelectric layer overlapping a gap portion in plan view. A recessed portion is provided in a portion of the support substrate overlapping the through-hole in plan view. The recessed portion extends farther toward a center of the IDT electrode in the electrode finger extending direction than the portion including the through-hole. One or more layers in the piezoelectric substrate are constraining layers that constrain the piezoelectric layer at a portion overlapping an intersection region in plan view, and the piezoelectric layer includes a protruding portion that protrudes farther in the electrode finger extending direction than at least one constraining layer.

20 Claims, 10 Drawing Sheets

(51) Int. Cl.
*H03H 9/145* (2006.01)
*H03H 9/25* (2006.01)

(56) References Cited

U.S. PATENT DOCUMENTS

| | | | | |
|---|---|---|---|---|
| 2013/0249647 | A1* | 9/2013 | Nakanishi .......... | H03H 9/02881<br>333/186 |
| 2014/0001919 | A1* | 1/2014 | Komatsu ............ | H03H 9/02818<br>310/313 B |
| 2015/0280689 | A1* | 10/2015 | Nakamura ......... | H03H 9/02834<br>333/195 |
| 2018/0212581 | A1* | 7/2018 | Matsumoto ........ | H03H 9/02535 |
| 2018/0358948 | A1 | 12/2018 | Gong et al. | |
| 2019/0334500 | A1* | 10/2019 | Horikawa .......... | H03H 9/02574 |
| 2019/0386638 | A1* | 12/2019 | Kimura .............. | H03H 9/02047 |
| 2022/0029601 | A1 | 1/2022 | Nagamoto | |

FOREIGN PATENT DOCUMENTS

| | | | |
|---|---|---|---|
| WO | 2018163860 | A1 | 9/2018 |
| WO | 2020209359 | A1 | 10/2020 |

OTHER PUBLICATIONS

Written Opinion in PCT/JP2022/000395, mailed Mar. 29, 2022, 3 pages.

* cited by examiner

ACOUSTIC WAVE DEVICE

CROSS REFERENCE TO RELATED APPLICATIONS

This application claims the benefit of priority to Japanese Patent Application No. 2021-003650 filed on Jan. 13, 2021 and is a Continuation Application of PCT Application No. PCT/JP2022/000395 filed on Jan. 7, 2022. The entire contents of each application are hereby incorporated herein by reference.

BACKGROUND OF THE INVENTION

1. Field of the Invention

The present invention relates to an acoustic wave device.

2. Description of the Related Art

Acoustic wave filter devices have been widely used for filters for mobile phones and the like. Japanese Unexamined Patent Application Publication No. 2011-101350 discloses an example of a sound wave device as an acoustic wave device in which a piston mode is used. In this acoustic wave device, an interdigital transducer (IDT) electrode is provided on a piezoelectric substrate. In the IDT electrode, a central region is disposed at a center in a direction in which an electrode finger extends, and a low acoustic velocity region and a high acoustic velocity region are disposed on both sides of the central region in this order. By establishing the piston mode with the above-described configuration, a spurious due to a transverse mode can be suppressed.

SUMMARY OF THE INVENTION

However, in such an acoustic wave device as described in Japanese Unexamined Patent Application Publication No. 2011-101350, it is difficult to sufficiently widen a frequency range in which the piston mode can be established. Thus, a frequency range in which the spurious due to the transverse mode can be suppressed is also likely to be narrow.

Preferred embodiments of the present invention provide acoustic wave devices that are each capable of suppressing a transverse mode in any frequency range.

An acoustic wave device according to a preferred embodiment of the present invention includes a piezoelectric substrate that is a laminate including a support including a support substrate and a piezoelectric layer on the support, and an IDT electrode on the piezoelectric layer and including paired busbars and a plurality of electrode fingers. In the IDT electrode, as viewed from an acoustic wave propagation direction, a region where the electrode fingers adjacent to each other overlap each other is an intersection region, regions between the intersection region and the paired busbars are paired gap regions, when a direction in which the plurality of electrode fingers extends is defined as an electrode finger extending direction, the paired gap regions include respective gap portions located on an extension line in the electrode finger extending direction of the plurality of electrode fingers. A through-hole is provided in a portion of the piezoelectric layer overlapping at least one of the gap portions in plan view, a hollow portion is provided in a portion of the support overlapping the through-hole in plan view, and the hollow portion extends farther toward a center side of the IDT electrode in the electrode finger extending direction than the portion provided with the through-hole. One or more layers other than the piezoelectric layer in the piezoelectric substrate are constraining layers that constrain the piezoelectric layer at a portion overlapping the intersection region in plan view, and the piezoelectric layer includes a protruding portion protruding farther in the electrode finger extending direction than at least one layer of the constraining layers.

According to acoustic wave devices according to preferred embodiments of the present invention, a transverse mode can be suppressed in any frequency range.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 8A to 8D are sectional views for explaining an example of a method for manufacturing the acoustic wave device according to the first preferred embodiment of the present invention.

DETAILED DESCRIPTION OF THE PREFERRED EMBODIMENTS

Hereinafter, specific preferred embodiments of the present invention will be described with reference to figures to clarify the present invention.

It should be noted that each preferred embodiment described in the present specification is merely exemplary, and partial replacement or combination of configurations is possible between different preferred embodiments.

Figure 1:
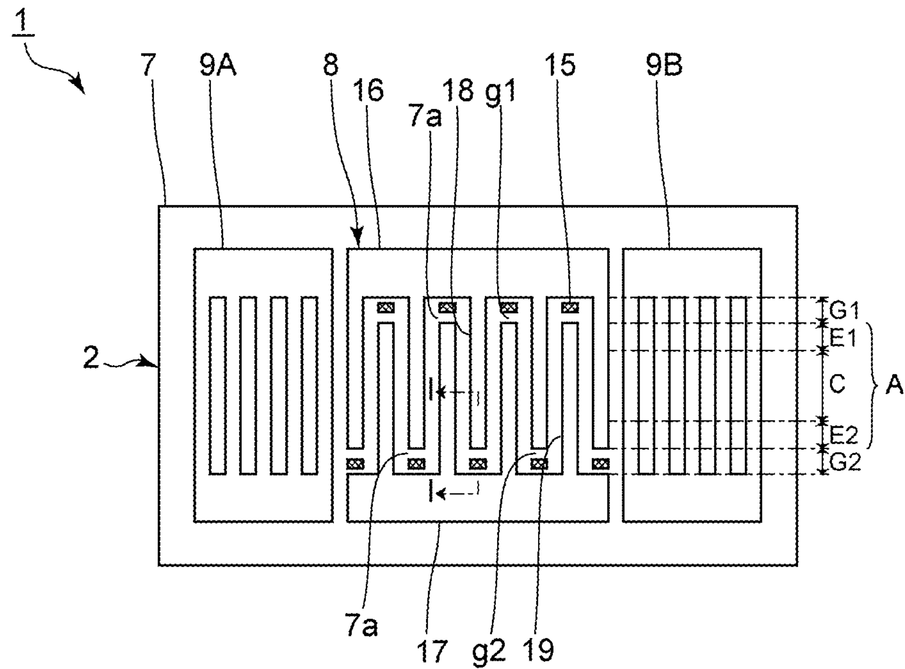
FIG. 1 is a plan view of an acoustic wave device according to a first preferred embodiment of the present invention.
Figure 2:
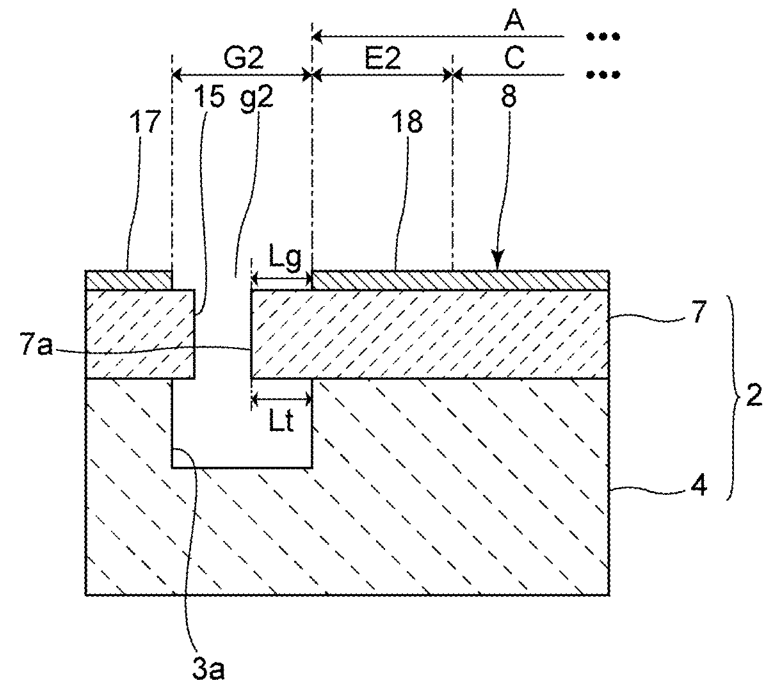
FIG. 2 is a sectional view taken along line I-I in FIG. 1.
Figure 3:
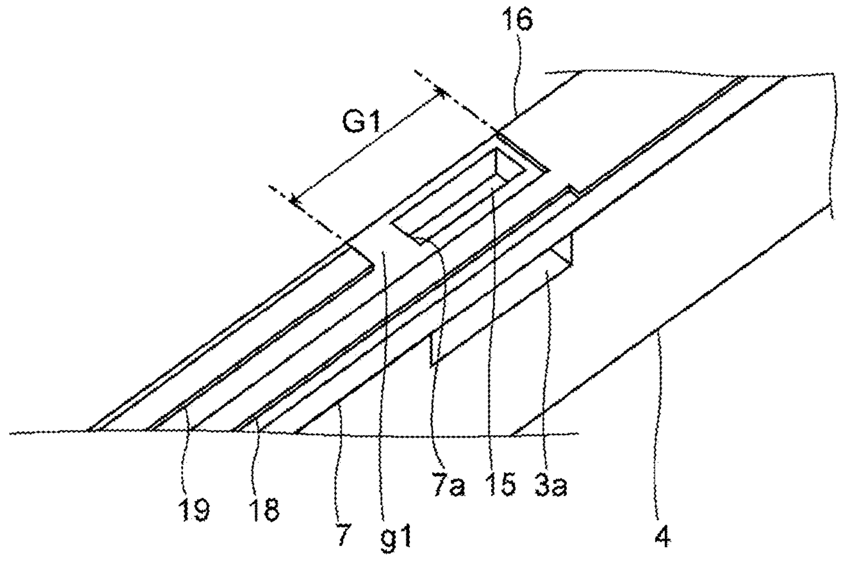
FIG. 3 is a perspective view illustrating a portion of the acoustic wave device according to the first preferred embodiment of the present invention.

FIG. 1 is a plan view of an acoustic wave device according to a first preferred embodiment of the present invention. FIG. 2 is a sectional view taken along line I-I in FIG. 1. FIG. 3 is a perspective view illustrating a portion of the acoustic wave device according to the first preferred embodiment. Note that, in FIG. 1, a through-hole to be described later is indicated by hatching.

As illustrated in FIG. 1, an acoustic wave device 1 includes a piezoelectric substrate 2. As illustrated in FIG. 2, the piezoelectric substrate 2 includes a support substrate 4 as a support and a piezoelectric layer 7. The piezoelectric layer 7 is provided on the support substrate 4.

Referring back to FIG. 1, an IDT electrode 8 is provided on the piezoelectric layer 7. An acoustic wave is excited by applying an AC voltage to the IDT electrode 8. A reflector 9A and a reflector 9B that are paired are provided on the piezoelectric layer 7 on respective sides in an acoustic wave propagation direction of the IDT electrode 8. The acoustic wave device 1 of the present preferred embodiment is a surface acoustic wave resonator. However, an acoustic wave device according to a preferred embodiment of the present invention may be, for example, a filter device or a multiplexer including a plurality of acoustic wave resonators.

The IDT electrode 8 includes a first busbar 16 and a second busbar 17, a plurality of first electrode fingers 18 and a plurality of second electrode fingers 19. The first busbar 16 and the second busbar 17 face each other. Each end on one side of the plurality of first electrode fingers 18 is connected to the first busbar 16. Each end on another side of the plurality of first electrode fingers 18 faces the second busbar 17 across a gap portion g2.

On the other hand, each end on one side of the plurality of second electrode fingers 19 is connected to the second busbar 17. Each end on another side of the plurality of second electrode fingers 19 faces the first busbar 16 across a gap portion g1. The plurality of first electrode fingers 18 and the plurality of second electrode fingers 19 interdigitate with each other. The IDT electrode 8, the reflector 9A, and the reflector 9B may be defined by a single-layer metal film or may be defined a laminated metal film.

Here, a direction in which the plurality of first electrode fingers 18 and the plurality of second electrode fingers 19 extend is defined as an electrode finger extending direction. Note that in the present preferred embodiment, the electrode finger extending direction and the acoustic wave propagation direction are perpendicular or substantially perpendicular to each other. The gap portion g2 described above is located on an extension line in the electrode finger extending direction of the first electrode finger 18. The gap portion g1 described above is located on an extension line in the electrode finger extending direction of the second electrode finger 19.

When λ is a wavelength defined by an electrode finger pitch of the IDT electrode 8, a thickness of the piezoelectric layer 7 is preferably equal to or less than about 1λ. In this case, an acoustic wave can be efficiently excited. Note that the electrode finger pitch is a center-to-center distance between adjacent electrode fingers.

As illustrated in FIG. 1, a region where the first electrode finger 18 and the second electrode finger 19 adjacent to each other overlap each other when viewed from the acoustic wave propagation direction is an intersection region A. The intersection region A includes a central region C, a first edge region E1 and a second edge region E2. The central region C is a region located centrally in the electrode finger extending direction in the intersection region A. On the other hand, the first edge region E1 and the second edge region E2 are disposed so as to sandwich the central region C in the electrode finger extending direction. The first edge region E1 is located at the first busbar 16 side. The second edge region E2 is located at the second busbar 17 side. Furthermore, the IDT electrode 8 includes a first gap region G1 and a second gap region G2. The first gap region G1 is located between the first edge region E1 and the first busbar 16. The second gap region G2 is located between the second edge region E2 and the second busbar 17.

Each gap portion g1 described above is located between the second electrode finger 19 and the first busbar 16. Thus, the first gap region G1 is a region including a plurality of the gap portions g1. Each gap portion g2 described above is located between the first electrode finger 18 and the second busbar 17. Thus, the second gap region G2 is a region including a plurality of the gap portions g2.

A plurality of through-holes 15 is provided in a portion of a portion of the piezoelectric layer 7 overlapping the first gap region G1 in plan view. In the present preferred embodiment, each through-hole 15 is provided in a portion of the piezoelectric layer 7 located between adjacent first electrode fingers 18. To be more specific, the through-hole 15 is provided in a portion of the piezoelectric layer 7 overlapping the gap portion g1 in plan view. Similarly, each through-hole 15 is also provided in a portion of the piezoelectric layer 7 overlapping each gap portion g2 in plan view. Note that "in plan view" refers to a direction viewed from above in FIG. 2 and the like.

As illustrated in FIG. 2, a hollow portion is provided in a portion of the support substrate 4 overlapping the through-hole 15 in plan view. In the present preferred embodiment, the hollow portion is a recessed portion 3*a*. The recessed portion 3*a* opens toward the piezoelectric layer 7 side. The recessed portion 3*a* extends farther toward a center side of the IDT electrode 8 in the electrode finger extending direction than the portion provided with the through-hole 15. As illustrated in FIG. 3, the recessed portion 3*a* extends so as to overlap the first electrode finger 18 in plan view. The recessed portion 3*a* extends over an entirety of the first gap region G1 in the acoustic wave propagation direction. Furthermore, another recessed portion 3*a* extends over an entirety of the second gap region G2 in the acoustic wave propagation direction.

The piezoelectric layer 7 is not supported by the support substrate 4 at a portion of the support substrate 4 provided with the recessed portion 3*a*. Thus, the piezoelectric layer 7 is not constrained by the support substrate 4 in this portion. On the other hand, at a portion not provided with the recessed portion 3*a*, the piezoelectric layer 7 is supported by the support substrate 4 and is constrained by the support substrate 4. Therefore, in the present preferred embodiment, the support substrate 4 is a constraining layer. The constraining layer is a layer that constrains the piezoelectric layer 7 at a portion overlapping the intersection region A in plan view.

One of the unique features of the present preferred embodiment is the piezoelectric layer 7 includes a protruding portion 7*a*. To be more specific, the protruding portion 7*a* is a portion that protrudes farther in the electrode finger extending direction than the support substrate 4 that is the constraining layer. Accordingly, a tip end of the protruding portion 7*a* can be made a free end, and a piston mode can be established. That is, a piston mode can be established regardless of acoustic velocity in each of the central region C, the first edge region E1, the second edge region E2, the first gap region G1, and the second gap region G2, a dimension in the electrode finger extending direction, a frequency, and the like of each of the above-described regions. Thus, a transverse mode can be suppressed in any frequency range. Hereinafter, this effect will be described in detail by comparing the first preferred embodiment with a comparative example.

Figure 4:
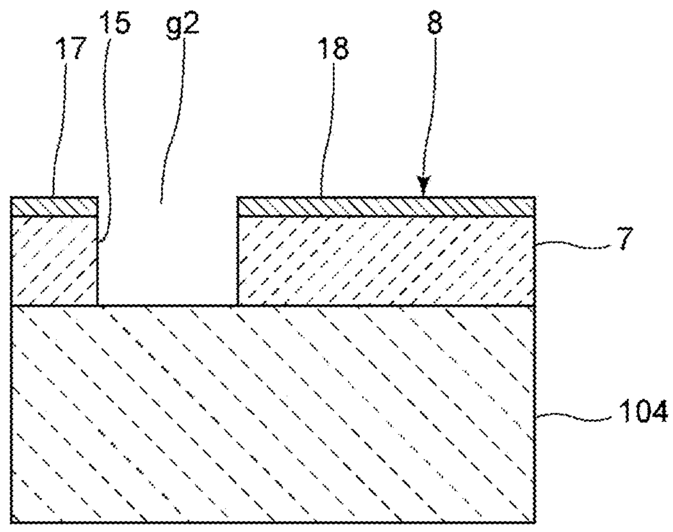
FIG. 4 is a sectional view of a portion of an acoustic wave device of a comparative example corresponding to a part illustrated in FIG. 2.

FIG. 4 is a sectional view of a portion of an acoustic wave device of the comparative example corresponding to a part illustrated in FIG. 2.

The comparative example is different from the first preferred embodiment in that a recessed portion is not provided in the support substrate 104.

An acoustic wave device having the configuration of the first preferred embodiment and an acoustic wave device of the comparative example were prepared. Design parameters of the acoustic wave devices of the first preferred embodiment and the comparative example are as follows.

Support substrate: material quartz, Euler angles (φ, θ, ψ) (45°, 90°, 90°)

Piezoelectric layer: material 42°YX-$LiTaO_3$, thickness 15% λ

IDT electrode: material Al, thickness 8% λ

Figure 5:
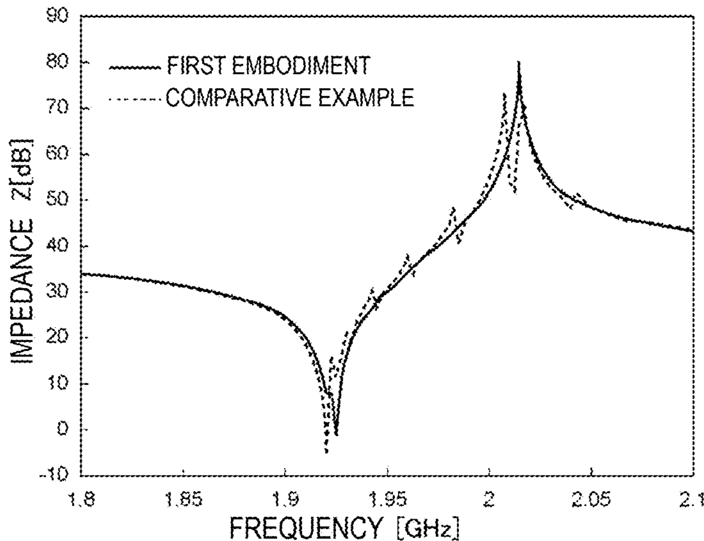
FIG. 5 is a graph illustrating impedance-frequency characteristics of the acoustic wave devices of the first preferred embodiment of the present invention and the comparative example.

FIG. 5 is a graph illustrating impedance-frequency characteristics of the acoustic wave devices of the first preferred embodiment and the comparative example.

As illustrated in FIG. 5, in the comparative example, a spurious due to a transverse mode occurs between a resonant frequency and an anti-resonant frequency. On the other hand, it can be seen that the spurious due to the transverse mode is suppressed in the first preferred embodiment.

Here, as illustrated in FIG. 2, a dimension of the protruding portion 7*a* in the electrode finger extending direction is defined as Lt. A dimension of a portion of the protruding portion 7*a* located at the gap portion g1 or the gap portion g2 in the electrode finger extending direction is defined as Lg. Note that Lg is a distance between a tip end of the first electrode finger 18 or the second electrode finger 19 and a tip end of the protruding portion 7*a*. As in the first preferred embodiment, Lt=Lg preferably is satisfied. When Lt=Lg, the transverse mode can be effectively suppressed. Note that it is not necessary that Lt=Lg.

In the acoustic wave device 1, Lt+Lg=(½)nλ, where n is a natural number. With this configuration, the transverse mode can be further suppressed. This will be described in more detail below.

The tip end of the protruding portion 7*a* in the piezoelectric layer 7 is not supported by the support substrate 4 or the like, and thus the tip end is a free end under any conditions. In addition, when Lt+Lg=(½)nλ, a base end of the protruding portion 7*a* is also a free end. Note that the base end of the protruding portion 7*a* is a boundary portion between a portion where the piezoelectric layer 7 is constrained by the constraining layer and a portion where the piezoelectric layer 7 is not constrained. In the first preferred embodiment, a portion of the piezoelectric layer 7 that is in contact with an edge portion of the recessed portion 3*a* in the support substrate 4 is the base end. The base end can be made a free end, and thus a piston mode is established. Thus, a transverse mode can be effectively suppressed.

Further, in the first preferred embodiment, Lt=Lg is preferably satisfied. In this case, the base end of the protruding portion 7*a* and an edge portion of the intersection region A in the electrode finger extending direction overlap each other in plan view. Thus, a piston mode can be established at the edge portion of the intersection region A.

Hereinafter, with reference to FIG. 6, it is illustrated that the base end of the protruding portion 7*a* can be made a free end.

Figure 6:
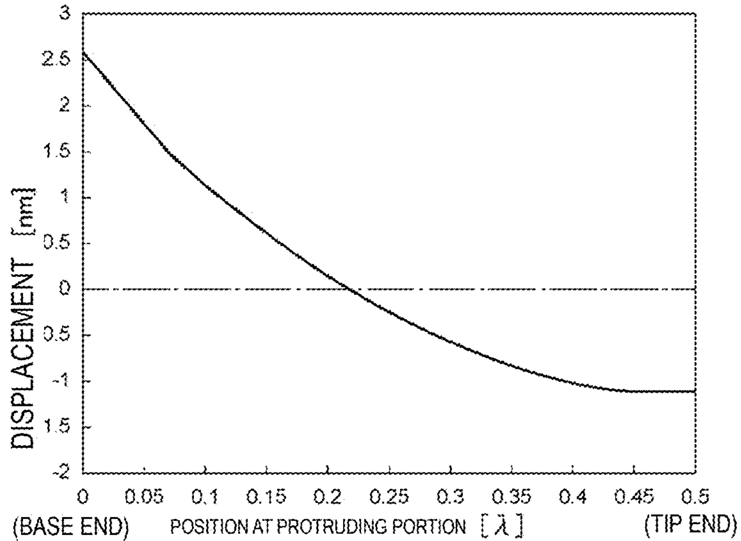
FIG. 6 is a graph illustrating a displacement distribution of a protruding portion of a piezoelectric layer in the first preferred embodiment of the present invention.

FIG. 6 is a graph illustrating a displacement distribution of the protruding portion of the piezoelectric layer in the first preferred embodiment. A horizontal axis of FIG. 6 indicates position at the protruding portion 7*a* in the electrode finger extending direction. 0 on the horizontal axis indicates a position of the base end. FIG. 6 illustrates an example where n=2, Lt=Lg=(½)λ, and Lt+Lg=1λ.

As illustrated in FIG. 6, displacement is not 0 at the base end of the protruding portion 7*a*. Thus, it can be seen that the base end is also close to a free end in the first preferred embodiment. Note that as long as Lt+Lg has a value near (½)nλ, the base end can be made close to a free end. However, Lt+Lg=(½)nλ is preferably satisfied. With this configuration, as described above, the transverse mode can be more reliably and further suppressed.

Figure 7:
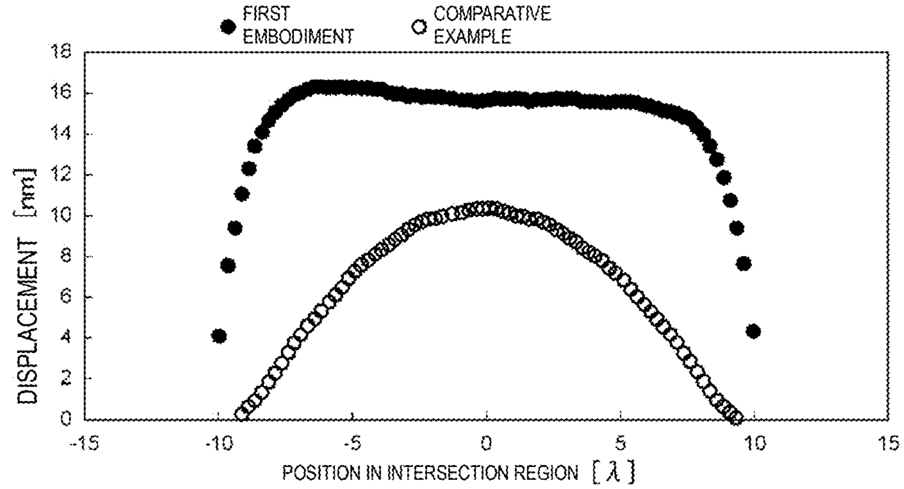
FIG. 7 is a diagram illustrating displacement distributions in the intersection region in the first preferred embodiment of the present invention and in an intersection region in the comparative example.

FIG. 7 is a diagram illustrating displacement distributions in the intersection region in the first preferred embodiment and in an intersection region in the comparative example. A horizontal axis of FIG. 7 indicates position in the intersection region in the electrode finger extending direction. 0 on the horizontal axis indicates a central position in the electrode finger extending direction of the intersection region.

As illustrated in FIG. 7, in the comparative example, displacement is the maximum at a center of the intersection region, and the displacement decreases in the intersection region toward the outside in the electrode finger extending direction. On the other hand, in the first preferred embodiment, it can be seen that displacement is constant over a wide range in the electrode finger extending direction. That is, it can be seen that a piston mode state is established in the first preferred embodiment.

As illustrated in FIG. 1, in the acoustic wave device 1, the plurality of through-holes 15 in the piezoelectric layer 7 is provided in portions overlapping all the gap portions g1 and all the gap portions g2 in plan view. Two recessed portions 3*a* are provided in the support substrate 4, and the recessed portion 3*a* on one side overlaps all the gap portions g1 in the acoustic wave propagation direction. The recessed portion 3*a* on another side overlaps all the gap portions g2 in the acoustic wave propagation direction. This makes it possible to dispose the protruding portions 7*a* of the piezoelectric layer 7 at all the gap portions g1 and all the gap portions g2. Thus, a transverse mode can be effectively suppressed. However, it is sufficient that the through-hole 15 is provided in a portion overlapping at least one gap portion of the plurality of gap portions g1 and the plurality of gap portions g2.

In the above description, an example of a case has been illustrated where the piezoelectric layer 7 is made of 42°YX-$LiTaO_3$. However, the cut angle and the material of the piezoelectric layer 7 are not limited to those described above. As the material of the piezoelectric layer 7, for example, lithium niobate, zinc oxide, aluminum nitride, quartz, PZT (lead zirconate titanate), or the like can be used.

In the example described above, quartz having the Euler angles (45°, 90°, 90°) is used for the support substrate 4, but the Euler angles and the material of the support substrate 4 are not limited to those described above. As the material of the support substrate 4, for example, piezoelectric materials such as aluminum oxide, lithium tantalate, and lithium niobate, various ceramics such as alumina, sapphire, magnesia, silicon nitride, aluminum nitride, silicon carbide, zirconia, cordierite, mullite, steatite, and forsterite, dielectrics such as diamond and glass, a semiconductor such as silicon or gallium nitride, or resin, or the like can be used.

Hereinafter, an example of a method for manufacturing the acoustic wave device 1 according to the first preferred embodiment will be described.

FIGS. 8A to 8D are sectional views for explaining the example of the method for manufacturing the acoustic wave device according to the first preferred embodiment.

Figure 8A:
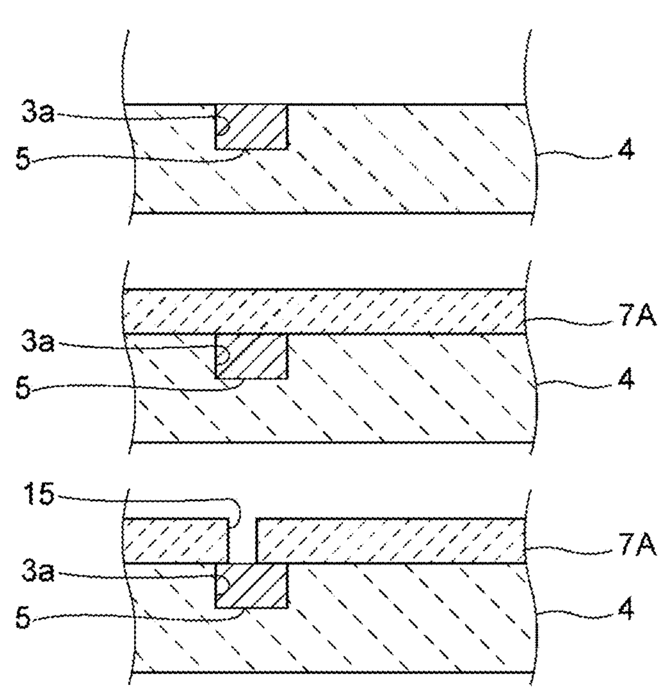

As illustrated in FIG. 8A, the recessed portion 3*a* is formed in the support substrate 4. The recessed portion 3*a* can be formed by, for example, providing a resist pattern on the support substrate 4 and then etching the support substrate 4, or the like. Note that after the etching, the resist pattern is peeled off. Next, a sacrificial layer 5 is formed in the recessed portion 3*a*. As a material of the sacrificial layer 5, for example, any material having selectivity with respect to a base material, including polysilicon, magnesium oxide, copper, ZnO, phosphosilicate glass (PSG), or the like can be used.

Next, as illustrated in FIG. 8B, the support substrate 4 and a piezoelectric layer 7A are bonded to each other. Next, a thickness of the piezoelectric layer 7A is adjusted. The adjustment of the thickness of the piezoelectric layer 7A can be performed by, for example, an ion slicing method or mechanical polishing.

Next, as illustrated in FIG. 8C, the through-hole 15 is provided in the piezoelectric layer 7A. The through-hole 15 can be formed by, for example, providing a resist pattern on the piezoelectric layer 7A and then etching the piezoelectric layer 7A, or the like. Note that after the etching, the resist pattern is peeled off.

Figure 8D:
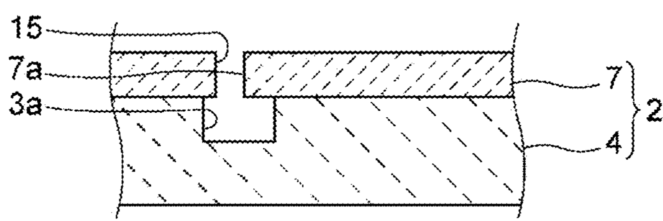

Next, as illustrated in FIG. 8D, the sacrificial layer 5 is removed using the through-hole 15. Thus, the protruding portion 7*a* of the piezoelectric layer 7 is formed. Thereafter, the IDT electrode 8, the reflector 9A and the reflector 9B illustrated in FIG. 1 are formed. The IDT electrode 8, the reflector 9A, and the reflector 9B can be formed by, for example, a photolithography method, or the like. As described above, the acoustic wave device 1 is obtained. However, the method for manufacturing the acoustic wave device 1 is not limited to the above.

Figure 9:
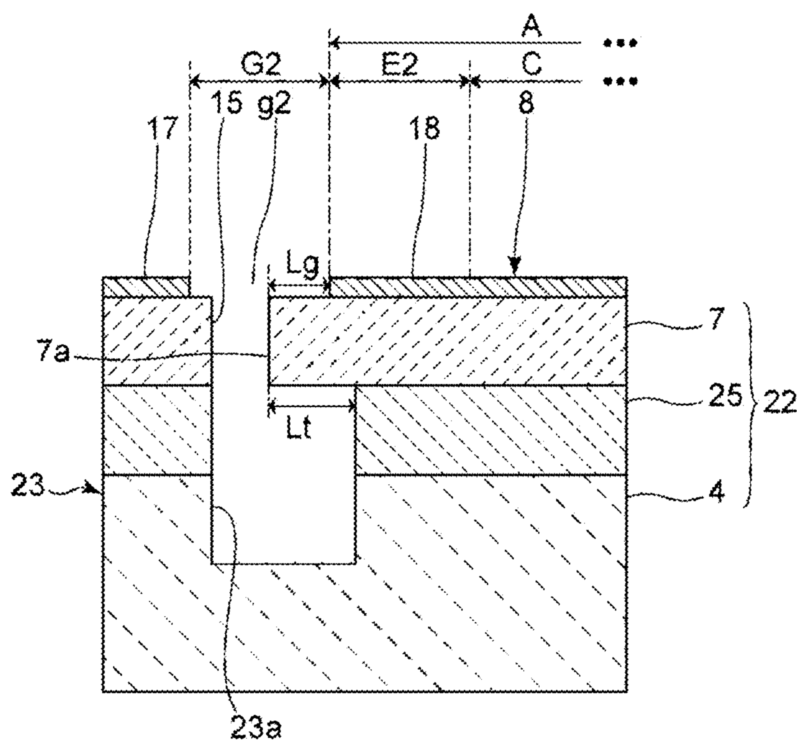
FIG. 9 is a sectional view of a portion of an acoustic wave device according to a second preferred embodiment of the present invention corresponding to the part illustrated in FIG. 2.

FIG. 9 is a sectional view of a portion of an acoustic wave device according to a second preferred embodiment corresponding to the portion illustrated in FIG. 2.

The second preferred embodiment is different from the first preferred embodiment in that a support member 23 includes the support substrate 4 and a low acoustic velocity film 25 and in that Lt and Lg are different from each other. The second preferred embodiment is also different from the first preferred embodiment in that a portion of a recessed portion 23*a* is flush with the through-hole 15 of the piezoelectric layer 7. Except for the above, the acoustic wave device of the present preferred embodiment has a similar configuration to that of the acoustic wave device 1 of the first preferred embodiment.

The low acoustic velocity film 25 is a film in which acoustic velocity is relatively low. More specifically, acoustic velocity of a bulk wave propagating through the low acoustic velocity film 25 is lower than acoustic velocity of a bulk wave propagating through the piezoelectric layer 7. In the present preferred embodiment, the low acoustic velocity film 25 is a silicon oxide film. However, the material of the low acoustic velocity film 25 is not limited to the above, and for example, a material mainly including glass, silicon oxynitride, lithium oxide, tantalum pentoxide, or a compound obtained by adding fluorine, carbon, or boron to silicon oxide as a main component may also be used.

Note that the low acoustic velocity film 25 is an intermediate layer. The intermediate layer is provided between the support substrate 4 and the piezoelectric layer 7.

As illustrated in FIG. 9, the recessed portion 23*a* is provided across the support substrate 4 and the low acoustic velocity film 25. In the present preferred embodiment, the low acoustic velocity film 25 and the support substrate 4 are constraining layers. Thus, the base end of the protruding portion 7*a* of the piezoelectric layer 7 is a portion overlapping an edge portion of the recessed portion 23*a* on a center side of the IDT electrode 8 in an electrode finger extending direction in plan view. Then, the recessed portion 23*a* reaches a portion overlapping the intersection region A in plan view. Thus, Lt>Lg is satisfied. Also in this case, since the protruding portion 7*a* includes a free end, it is possible to suppress a transverse mode in any frequency range as in the first preferred embodiment.

It should be noted that Lt<Lg may hold. In this case, the edge portion of the recessed portion 23*a* on the center side of the IDT electrode 8 in the electrode finger extending direction overlaps the first gap region G1 or the second gap region G2 in plan view.

Here, in an acoustic wave device including a piezoelectric substrate 22 similar to that of the second preferred embodiment, transverse mode level was measured while changing Lt and Lg. Note that a maximum change amount [dB] of S11 characteristics within a band of the acoustic wave device was defined as the transverse mode level. Here, "within a band" means "within a band from a resonant frequency to an anti-resonant frequency". Design parameters of the above-described acoustic wave device were as follows.

Support substrate 4: material Si

Piezoelectric layer 7: material 50° YX—$LiTaO_3$, thickness 30% λ

Low acoustic velocity film 25: material $SiO_2$, thickness 33% λ

IDT electrode 8: material Al, thickness 8% λ

Figure 10:
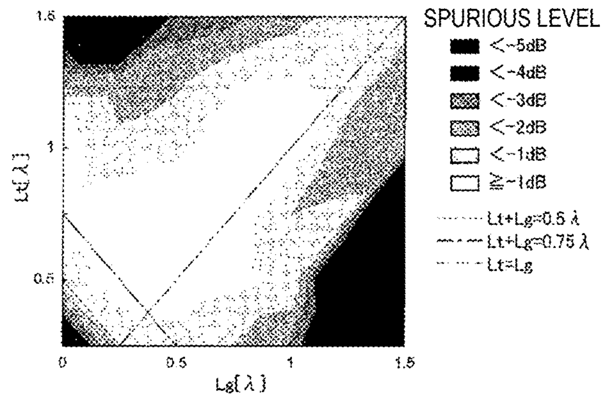
FIG. 10 is a graph illustrating a relationship between Lt and Lg, and transverse mode level.

FIG. 10 is a graph illustrating a relationship between Lt and Lg, and transverse mode level. In FIG. 10, when the color is closer to white, it indicates that a spurious is further suppressed.

A dashed line in FIG. 10 indicates spurious level of Lt+Lg=0.5λ. In FIG. 10, an upper right region with respect to the dashed line is a region of Lt+Lg≥0.5λ. It can be seen that the spurious is effectively suppressed when Lt+Lg≥0.5λ is satisfied. Further, in FIG. 10, an upper right region with respect to an alternate long and short dash line is a region where Lt+Lg≥0.75λ is satisfied. It can be seen that the spurious is further suppressed when Lt+Lg≥0.75λ is satisfied. Thus, preferably Lt+Lg≥0.5λ, that is, Lt+Lg≥(½)λ is satisfied, and more preferably Lt+Lg≥0.75λ, that is, Lt+Lg≥(¾)λ is satisfied. A two dot chain line in FIG. 10 indicates cases where Lt=Lg is satisfied. In this case, it can be seen that the spurious can be effectively suppressed regardless of the value of Lt+Lg.

Here, the support substrate 4 is preferably a high acoustic velocity support substrate. The high acoustic velocity support substrate is a substrate in which acoustic velocity is relatively high. Acoustic velocity of a bulk wave propagating through the high acoustic velocity support substrate is higher than acoustic velocity of an acoustic wave propagating through the piezoelectric layer 7. As a material of the high acoustic velocity support substrate, for example, a medium including the above-described material as a main component, such as silicon, aluminum oxide, silicon carbide, silicon nitride, silicon oxynitride, sapphire, lithium tantalate, lithium niobate, quartz, alumina, zirconia, cordierite, mullite, steatite, forsterite, magnesia, a diamond-like carbon (DLC) film, diamond, or the like can be used.

When the support substrate 4 is a high acoustic velocity support substrate, in the piezoelectric substrate 22, the high acoustic velocity support substrate, the low acoustic velocity film 25 and the piezoelectric layer 7 are laminated in this order. Accordingly, energy of an acoustic wave can be effectively confined to the piezoelectric layer 7 side.

Figure 11:
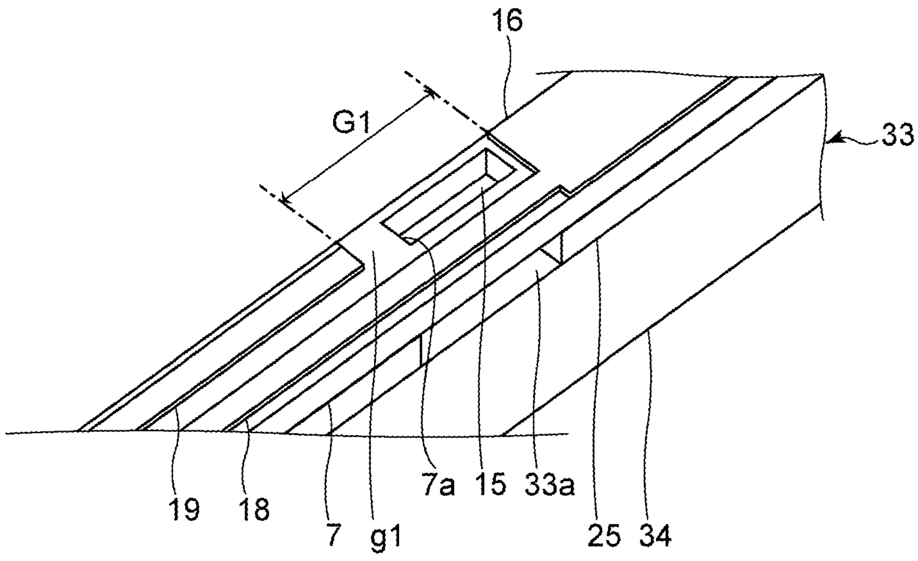
FIG. 11 is a perspective view illustrating a portion of an acoustic wave device according to a third preferred embodiment of the present invention.

FIG. 11 is a perspective view illustrating a portion of an acoustic wave device according to a third preferred embodiment.

The present preferred embodiment is different from the second preferred embodiment in that a support substrate 34 does not have a recessed portion. Except for the above, the acoustic wave device of the present preferred embodiment has a similar configuration to that of the acoustic wave device of the second preferred embodiment.

In the present preferred embodiment, a through-hole 33*a* reaching the support substrate 34 is provided in the low acoustic velocity film 25. A hollow portion of a support member 33 in the present preferred embodiment is the through-hole 33*a*. In this case as well, since the protruding portion 7*a* of the piezoelectric layer 7 includes a free end, a transverse mode can be suppressed in any frequency range as in the second preferred embodiment.

In the present preferred embodiment, two through-holes 33*a* are provided in the low acoustic velocity film 25. One of the through-holes 33*a* is provided over an entirety of the first gap region G1 in an acoustic wave propagation direction. The other through-hole 33*a* is provided over an entirety of the second gap region G2 in the acoustic wave propagation direction. Thus, a width of the protruding portion 7*a* is equal to a width of the through-hole 15. Note that the widths of the respective protruding portion 7*a* and through-hole 15 are dimensions in the respective acoustic wave propagation directions thereof.

As illustrated in FIG. 11, the protruding portion 7*a* located in the first gap region G1 is provided at the gap portion g1. Similarly, the protruding portion 7*a* located in the second gap region G2 is provided at the gap portion g2. When respective widths of the gap portion g1 and the gap portion g2 are set to dimensions in respective acoustic wave propagation directions thereof, the width of the protruding portion 7*a* is equal to or less than the width of the gap portion g1 or the gap portion g2.

Figure 12:
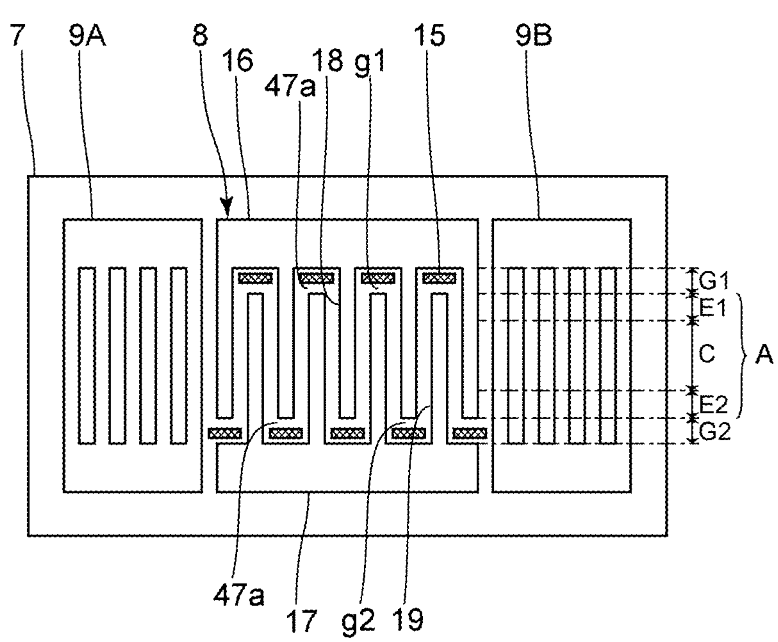
FIG. 12 is a plan view of an acoustic wave device according to a first modification of the third preferred embodiment of the present invention.

However, the relationship between the width of the protruding portion 7*a* and the widths of the gap portion g1 and the gap portion g2 is not limited to the above. For example, in a first modification of the third preferred embodiment illustrated in FIG. 12, a width of a protruding portion 47*a* is greater than a width of the gap portion g1 and a width of the gap portion g2. Accordingly, the protruding portion 47*a* may reach a portion other than the gap portion g1 between the first electrode fingers 18 adjacent to each other. Similarly, the protruding portion 47*a* may reach a portion other than the gap portion g2 between the second electrode fingers 19 adjacent to each other.

Here, a relationship between width of the protruding portion 7*a* and spurious level was obtained by simulation. Note that the width of the protruding portion 7*a* was varied by varying a width of the through-hole 15 of the piezoelectric layer 7. Design parameters of the acoustic wave device were set to be similar to those when the relationship in FIG. 10 was obtained.

Figure 13:
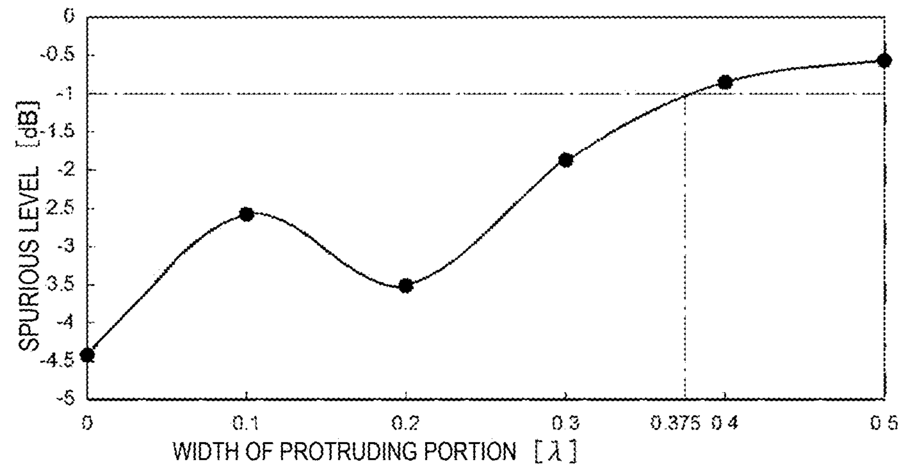
FIG. 13 is a graph illustrating a relationship between width of the protruding portion and spurious level.

FIG. 13 is a graph illustrating a relationship between width of the protruding portion and spurious level.

As illustrated in FIG. 13, when the width of the protruding portion 7*a* is equal to or greater than about 0.375λ, that is, about (⅜)λ, the spurious level can be made to be equal to or greater than about −1 dB, for example. Thus, the width of the protruding portion 7*a* is preferably equal to or greater than about (⅜)λ. Accordingly, it is possible to further suppress the spurious due to a transverse mode.

FIG. 13 also illustrates a result when the width of the protruding portion 7*a* is about 0.5λ. However, the first electrode finger 18 and the second electrode finger 19 are laminated on the piezoelectric layer 7. Thus, it is difficult to manufacture an acoustic wave device in which a width of the through-hole 15 is about 0.5λ and a width of the protruding portion 7*a* is about 0.5λ. On the other hand, FIG. 13 illustrates that when the protruding portion 7*a* is equal to or greater than about 0.2λ, as the width of the protruding portion 7*a* is increased, the spurious can be further suppressed. Thus, the protruding portion 7*a* is preferably provided in each of all of regions between the first electrode fingers 18 and each of all of regions between the second electrode fingers 19. Accordingly, a spurious due to a transverse mode can be further suppressed.

Figure 14:
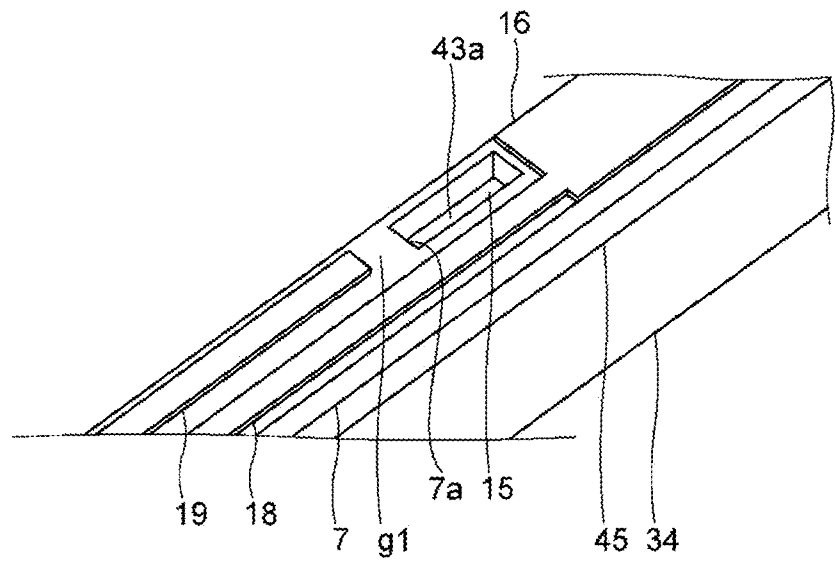
FIG. 14 is a perspective view illustrating a portion of an acoustic wave device according to a second modification of the third preferred embodiment of the present invention.

In the present preferred embodiment, one through-hole 33*a* is provided in each of a portion overlapping the first gap region G1 and a portion overlapping the second gap region G2 in plan view. However, a plurality of recessed portions may be provided in each of a portion overlapping the first gap region G1 and a portion overlapping the second gap region G2 in plan view. For example, in a second modification of the third preferred embodiment illustrated in FIG. 14, a plurality of through-holes 43*a* is provided in a low acoustic velocity film 45. The through-holes 43*a* are provided in portions of the low acoustic velocity film 45 overlapping the respective through-holes 15 of the piezoelectric layer 7 in plan view. In this case, a width of the protruding portion 7*a* is defined by a narrower width out of a width of the through-hole 15 of the piezoelectric layer 7 and a width of the through-hole 43*a* of the low acoustic velocity film 45.

In the related art, a piston mode was established by making the central region C, the first edge region E1 and the second edge region E2, and the first gap region G1 and the second gap region G2 different from each other in terms of acoustic velocity. In this case, it is necessary to appropriately define a width of each region and acoustic velocity differences among the regions in accordance with an anisotropy coefficient γ. The anisotropy coefficient γ in a surface acoustic wave resonator is the following coefficient. When an array direction of grating electrodes is defined as an X direction and an intersecting direction is defined as a Y direction, it is assumed that a wave number $\beta_\theta$ of an acoustic wave propagating in a direction rotated by an angle θ heading from the X direction to the Y direction can be parabolic-approximated with respect to the angle θ. This case can be expressed as $\beta_x^2+\gamma\beta_y^2=\beta_\theta^2$. The coefficient γ in this equation is the anisotropy coefficient γ. In general, it is known that as the anisotropy coefficient γ increases, a suitable acoustic velocity difference for establishing a piston mode increases. While a piston mode operating frequency range is limited, a frequency spacing of transverse modes is widened, thus it is difficult to suppress a higher order transverse mode.

On the other hand, in the case where a piston mode is established by providing the protruding portion **7*a* in the piezoelectric layer 7** as in the present invention, a spurious due to a transverse mode can be suppressed with the anisotropy coefficient γ in a wide range without adjusting the widths of the respective regions. Details of this effect will be described below.

Each of the anisotropy coefficient γ and the spurious level was calculated using a simulation model in which the thickness of the IDT electrode 8 was varied. With this, a relationship between thickness of the IDT electrode 8, and the anisotropy coefficient γ and spurious level was obtained. In calculating the anisotropy coefficient γ, the following two sets of design parameters of the acoustic wave device were used. The first set of design parameters are as follows.

- Support substrate 4: material Si
- Piezoelectric layer 7: material 50° YX—$LiTaO_3$, thickness 20% λ
- Low acoustic velocity film 45: material $SiO_2$, thickness 20% λ
- IDT electrode 8: material Al, thickness changed in 2% λ increments in a range from equal to or greater than 6% λ and equal to or less than 18% λ.

The second set of design parameters are as follows.

- Support substrate 4: material Si
- Piezoelectric layer 7: material 50° YX—$LiTaO_3$, thickness 30% λ
- Low acoustic velocity film 45: material $SiO_2$, thickness 30% λ
- IDT electrode 8: material Al, thickness changed in 2% λ increments in a range from equal to or greater than 2%λ and equal to or less than 12% λ.

Figure 15:
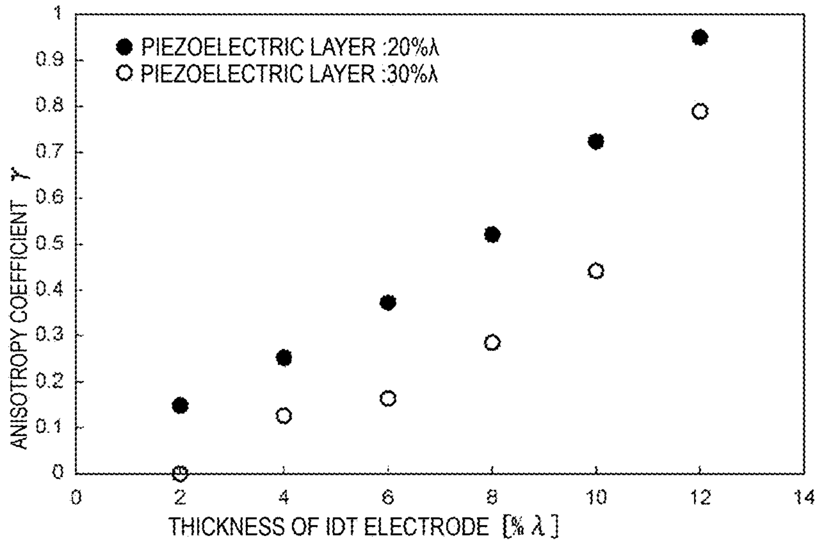
FIG. 15 is a graph illustrating a relationship between thickness of an IDT electrode and anisotropy coefficient.

FIG. 15 is a graph illustrating a relationship between thickness of the IDT electrode and anisotropy coefficient.

As illustrated in FIG. 15, it can be seen that the anisotropy coefficient γ changes depending on the thickness of the piezoelectric layer 7 and the thickness of the IDT electrode 8. Further, behavior of the spurious level in a case where the second set of design parameters is used and the anisotropy coefficient γ is changed by changing the thickness of the IDT electrode 8 is illustrated. Note that the thickness of the IDT electrode 8 was changed in about 2% λ increments in the range from equal to or greater than about 6%λ and equal to or less than about 18% λ, for example.

Figure 16:
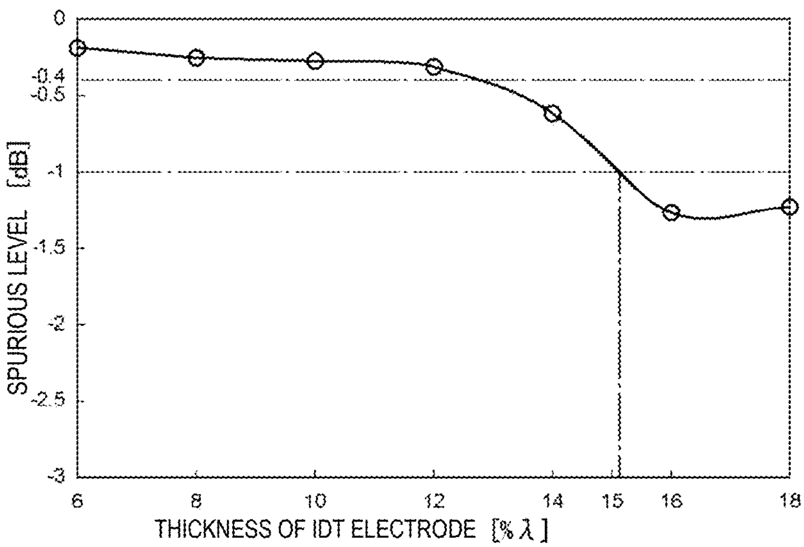
FIG. 16 is a graph illustrating a relationship between thickness of the IDT electrode and spurious level.

FIG. 16 is a graph illustrating a relationship between thickness of the IDT electrode and spurious level.

As illustrated in FIG. 16, the spurious level is higher than about −0.4 dB in a wide range in which the thickness of the IDT electrode 8 is equal to or greater than about 6% λ and equal to or less than about 12% λ, for example, and a spurious is effectively suppressed. Thus, as is clear from FIG. 15, a spurious can be effectively suppressed in a wide range in which the anisotropy coefficient γ is equal or approximately equal to or greater than about 0.17 and equal to or less than about 0.79, for example. Furthermore, as illustrated in FIG. 16, it can be seen that spurious can be suppressed such that the spurious level is equal to or greater than about −1 dB in a wide range in which the thickness of the IDT electrode 8 is equal to or greater than about 6% λ and equal to or less than about 15% λ, for example.

As described above, in the second preferred embodiment illustrated in FIG. 9, the low acoustic velocity film 25 and the support substrate 4 are the constraining layers. Here, it is sufficient that the protruding portion **7*a* of the piezoelectric layer 7 protrudes further in an electrode finger extending direction than at least one of the constraining layers. Thus, a hollow portion may be provided only in the support substrate 4, which is one of the constraining layers. The low acoustic velocity film 25 is not necessarily provided with a through-hole or the like. Also in this case, the protruding portion 7*a* of the piezoelectric layer 7** includes a free end. Thus, a piston mode is established, and a spurious due to a transverse mode can be suppressed.

Figure 17:
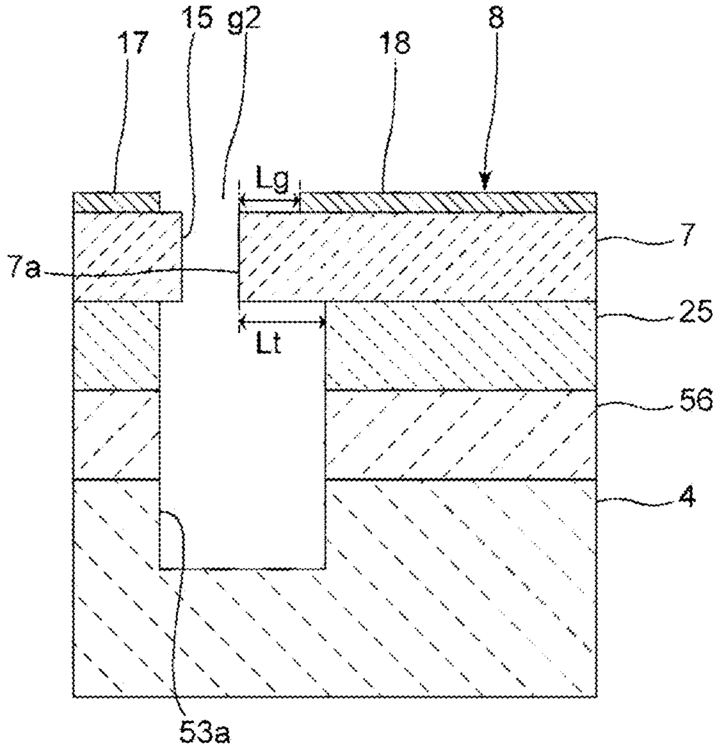
FIG. 17 is a sectional view of a portion of an acoustic wave device according to a fourth preferred embodiment of the present invention corresponding to the portion illustrated in FIG. 2.

FIG. 17 is a sectional view of a portion of an acoustic wave device according to a fourth preferred embodiment corresponding to the part illustrated in FIG. 2.

The present preferred embodiment is different from the second preferred embodiment in that an intermediate layer includes a high acoustic velocity film 56. Except for the above, the acoustic wave device of the present preferred embodiment has a similar configuration to that of the acoustic wave device of the second preferred embodiment. The high acoustic velocity film 56 is provided between the support substrate 4 and the low acoustic velocity film 25.

The high acoustic velocity film 56 is a film in which acoustic velocity is relatively high. More specifically, acoustic velocity of a bulk wave propagating through the high acoustic velocity film 56 is higher than acoustic velocity of an acoustic wave propagating through the piezoelectric layer 7. As a material of the high acoustic velocity film 56, for example, a medium including the above-described material as a main component, such as silicon, aluminum oxide, silicon carbide, silicon nitride, silicon oxynitride, sapphire, lithium tantalate, lithium niobate, quartz, alumina, zirconia, cordierite, mullite, steatite, forsterite, magnesia, a diamond-like carbon (DLC) film, diamond, or the like can be used.

In the present preferred embodiment, the high acoustic velocity film 56, the low acoustic velocity film 25 and the piezoelectric layer 7 are laminated in this order. Accordingly, energy of an acoustic wave can be effectively confined to the piezoelectric layer 7 side. Note that a thickness of the high acoustic velocity film 56 is preferably equal to or greater than 1λ. With such configuration, a Q value can be further increased.

A recessed portion **53*a* is provided across the support substrate 4, the high acoustic velocity film 56, and the low acoustic velocity film 25. Thus, the piezoelectric layer 7 includes the protruding portion 7*a*. Since the protruding portion 7*a*** includes a free end, it is possible to suppress a transverse mode in any frequency range as in the second preferred embodiment.

Note that as in the case illustrated in FIG. 11, the recessed portion **53*a* may be provided only in the low acoustic velocity film 25**.

The intermediate layer may be defined by the high acoustic velocity film 56 alone. Also in this case, since the high acoustic velocity film 56 and the piezoelectric layer 7 are laminated in this order, energy of an acoustic wave can be confined to the piezoelectric layer 7 side.

Figure 18:
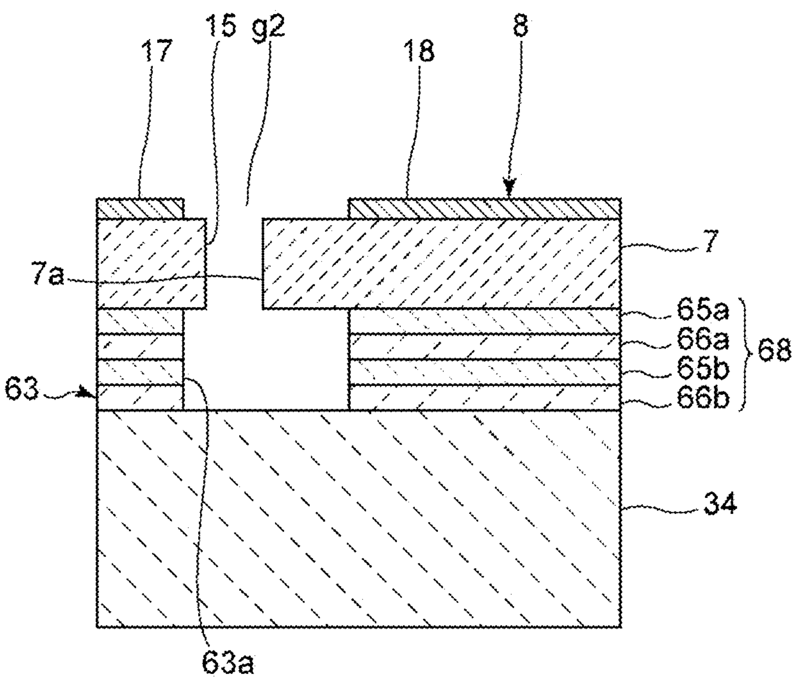
FIG. 18 is a sectional view of a portion of an acoustic wave device according to a fifth preferred embodiment of the present invention corresponding to the portion illustrated in FIG. 2.

FIG. 18 is a sectional view of a portion of an acoustic wave device according to a fifth preferred embodiment corresponding to the part illustrated in FIG. 2.

The present preferred embodiment is different from the third preferred embodiment in that an intermediate layer is an acoustic reflection film 68. The acoustic reflection film 68 is provided between the support substrate 34 and the piezoelectric layer 7. Except for the above, the acoustic wave device of the present preferred embodiment has a similar configuration to that of the acoustic wave device of the third preferred embodiment.

The acoustic reflection film 68 is a laminate of a plurality of acoustic impedance layers. More specifically, the acoustic reflection film 68 includes a plurality of low acoustic impedance layers and a plurality of high acoustic impedance layers. The low acoustic impedance layer is a layer in which acoustic impedance is relatively low. The plurality of low acoustic impedance layers of the acoustic reflection film 68 includes a low acoustic impedance layer 65*a* and a low acoustic impedance layer 65*b*. On the other hand, the high acoustic impedance layer is a layer in which acoustic impedance is relatively high. The plurality of high acoustic impedance layers of the acoustic reflection film 68 includes a high acoustic impedance layer 66*a* and a high acoustic impedance layer 66*b*. The low acoustic impedance layer and the high acoustic impedance layer are alternately laminated. Note that the low acoustic impedance layer 65*a* is a layer located closest to the piezoelectric layer 7 side in the acoustic reflection film 68.

The acoustic reflection film 68 includes two low acoustic impedance layers and two high acoustic impedance layers. However, it is sufficient that the acoustic reflection film 68 includes at least one low acoustic impedance layer and at least one high acoustic impedance layer. As a material of the low acoustic impedance layer, for example, silicon oxide, aluminum, or the like can be used. As a material of the high acoustic impedance layer, for example, metal such as platinum or tungsten, or a dielectric such as aluminum nitride or silicon nitride can be used. Since the acoustic reflection film 68 is provided, energy of an acoustic wave can be effectively confined to the piezoelectric layer 7 side.

In a support member 63, a recessed portion 63*a* is provided only in the acoustic reflection film 68. A hollow portion of the support member 63 is the recessed portion 63*a*. Here, in the present preferred embodiment, constraining layers are the acoustic reflection film 68 and the support substrate 34. Since the recessed portion 63*a* is provided in the acoustic reflection film 68, the protruding portion 7*a* of the piezoelectric layer 7 includes a free end. Thus, as in the third preferred embodiment, a transverse mode can be suppressed in any frequency range.

Figure 19:
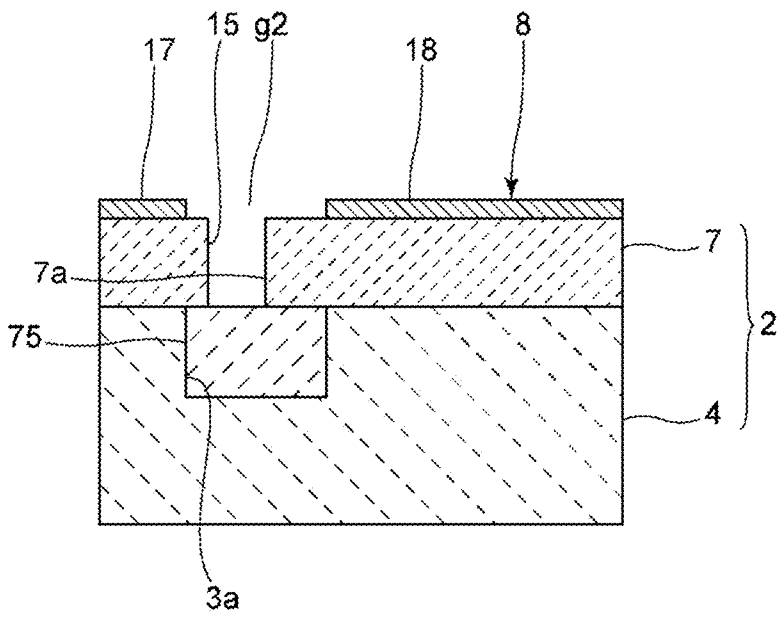
FIG. 19 is a sectional view of a portion of an acoustic wave device according to a sixth preferred embodiment of the present invention corresponding to the part illustrated in FIG. 2.

FIG. 19 is a sectional view of a portion of an acoustic wave device according to a sixth preferred embodiment corresponding to the portion illustrated in FIG. 2.

The present preferred embodiment is different from the first preferred embodiment in that a low acoustic impedance member 75 is provided in the recessed portion 3*a* of the support substrate 4. The low acoustic impedance member 75 is a member in which acoustic impedance is lower than that in the piezoelectric layer 7. Except for the above, the acoustic wave device of the present preferred embodiment has a similar configuration to that of the acoustic wave device 1 of the first preferred embodiment. For example, as a material of the low acoustic impedance member 75, silicon oxide or the like can be used.

In the present preferred embodiment, a constraining layer is the support substrate 4. Thus, the protruding portion 7*a* of the piezoelectric layer 7 is disposed similarly to that in the first preferred embodiment. Note that the low acoustic impedance member 75 is less likely to constrain the piezoelectric layer 7 and is less likely to inhibit a vibration of the piezoelectric layer 7. Thus, the protruding portion 7*a* includes a free end. Thus, a transverse mode can be suppressed in any frequency range.

Figure 20:
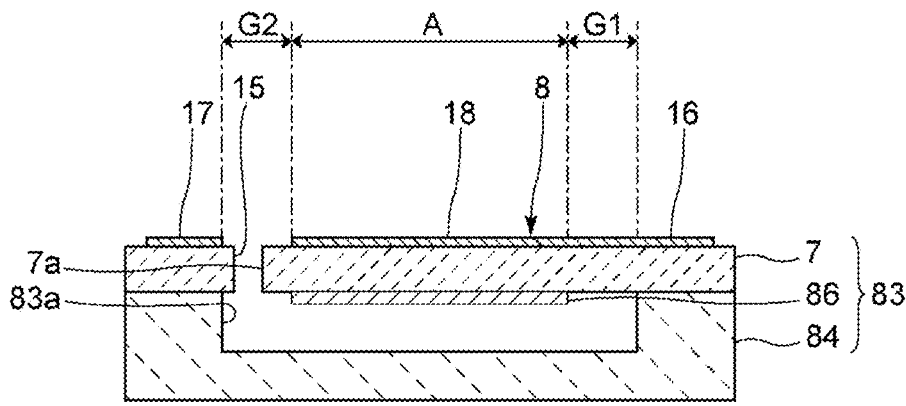
FIG. 20 is a sectional view of an acoustic wave device according to a seventh preferred embodiment of the present invention taken in an electrode finger extending direction and a laminate direction.

FIG. 20 is a sectional view of an acoustic wave device according to a seventh preferred embodiment taken along an electrode finger extending direction and a laminate direction.

The present preferred embodiment differs from the first preferred embodiment in a configuration of a support member 83. Except for the above, the acoustic wave device of the present preferred embodiment has a similar configuration to that of the acoustic wave device 1 of the first preferred embodiment.

To be more specific, a recessed portion 83*a* of a support substrate 84 in the support member 83 overlaps the intersection region A, the first gap region G1 and the second gap region G2 of the IDT electrode 8 in plan view. The present preferred embodiment is suitable, for example, when a plate wave is used. Note that the recessed portion 83*a* may overlap a portion of the intersection region A in plan view.

Further, the support member 83 includes a high acoustic impedance film 86. The high acoustic impedance film 86 is provided on a main surface of the piezoelectric layer 7 facing the support substrate 84. The high acoustic impedance film 86 is a film in which acoustic impedance is higher than that in the piezoelectric layer 7. The high acoustic impedance film 86 is disposed in the recessed portion 83*a*. As a material of the high acoustic impedance film 86, for example, aluminum nitride, silicon nitride, or the like can be used.

In the present preferred embodiment, the high acoustic impedance film 86 is a constraining layer. That is, in plan view, the high acoustic impedance film 86 includes a portion overlapping the intersection region A and constrains the piezoelectric layer 7 at the portion. In this case, the protruding portion 7*a* of the piezoelectric layer 7 is a portion where the piezoelectric layer 7 protrudes further in an electrode finger extending direction than the high acoustic impedance film 86 in plan view. Since the protruding portion 7*a* includes a free end, it is possible to suppress a transverse mode in any frequency range as in the first preferred embodiment.

As illustrated in FIG. 20, the high acoustic impedance film 86 overlaps an entirety of the intersection region A and does not overlap the first gap region G1 or the second gap region G2 in plan view. However, the disposition of the high acoustic impedance film 86 is not limited to the above. The high acoustic impedance film 86, as the constraining layer, only needs to overlap the intersection region A in plan view so as to form the protruding portion 7*a*.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a piezoelectric substrate that is a laminate including a support including a support substrate and a piezoelectric layer on the support; and an IDT electrode on the piezoelectric layer and including paired busbars and a plurality of electrode fingers; wherein in the IDT electrode, as viewed from an acoustic wave propagation direction, a region where the electrode fingers adjacent to each other overlap each other is an intersection region, regions between the intersection region and the paired busbars are paired gap regions, when a direction in which the plurality of electrode fingers extends is defined as an electrode finger extending direction, the paired gap regions include respective gap portions located on an extension line in the electrode finger extending direction of the plurality of electrode fingers;

a through-hole is provided in a portion of the piezoelectric layer overlapping at least one of the gap portions in plan view;

a hollow portion is provided in a portion of the support overlapping the through-hole in plan view, the hollow portion extends farther toward a center side of the IDT electrode in the electrode finger extending direction than the portion provided with the through-hole;

one or more layers other than the piezoelectric layer in the piezoelectric substrate are constraining layers that constrain the piezoelectric layer at a portion overlapping the intersection region in plan view, and the piezoelectric layer includes a protruding portion protruding farther in the electrode finger extending direction than at least one layer of the constraining layers.

2. The acoustic wave device according to claim 1, wherein Lt=Lg, where Lt is a dimension of the protruding portion in the electrode finger extending direction, and Lg is a dimension of a portion of the protruding portion located at each of the gap portions in the electrode finger extending direction.

3. The acoustic wave device according to claim 1, wherein $Lt+Lg \geq (1/2)\lambda$, where Lt is a dimension of the protruding portion in the electrode finger extending direction, Lg is a dimension of a portion of the protruding portion located at each of the gap regions in the electrode finger extending direction, and $\lambda$ is a wavelength defined by an electrode finger pitch of the IDT electrode.

4. The acoustic wave device according to claim 3, wherein $Lt+Lg \geq (3/4)\lambda$.

5. The acoustic wave device according to claim 3, wherein $Lt+Lg=(1/2)n\lambda$, where n is a natural number.

6. The acoustic wave device according to claim 1, wherein a dimension of the protruding portion in the acoustic wave propagation direction is equal to or greater than about $3/8\lambda$, where $\lambda$ is a wavelength defined by an electrode finger pitch of the IDT electrode.

7. The acoustic wave device according to claim 1, wherein the support is defined by the support substrate alone, and the support substrate is defined by the constraining layer.

8. The acoustic wave device according to claim 1, wherein the support includes an intermediate layer between the support substrate and the piezoelectric layer;

the hollow portion is provided in at least one of the support substrate and the intermediate layer; and the intermediate layer and the support substrate include the constraining layers.

9. The acoustic wave device according to claim 8, wherein the intermediate layer includes a low acoustic velocity film; and an acoustic velocity of a bulk wave propagating through the low acoustic velocity film is lower than an acoustic velocity of a bulk wave propagating through the piezoelectric layer.

10. The acoustic wave device according to claim 8, wherein the intermediate layer includes a high acoustic velocity film; and an acoustic velocity of a bulk wave propagating through the high acoustic velocity film is higher than an acoustic velocity of an acoustic wave propagating through the piezoelectric layer.

11. The acoustic wave device according to claim 10, wherein a thickness of the high acoustic velocity film is equal to or greater than $1\lambda$, where $\lambda$ is a wavelength defined by an electrode finger pitch of the IDT electrode.

12. The acoustic wave device according to claim 8, wherein the intermediate layer is an acoustic reflection film; and the acoustic reflection film includes at least one low acoustic impedance layer in which acoustic impedance is relatively low and at least one high acoustic impedance layer in which acoustic impedance is relatively high, and the low acoustic impedance layer and the high acoustic impedance layer are alternately laminated.

13. The acoustic wave device according to claim 1, wherein the support includes a high acoustic impedance film on a main surface of the piezoelectric layer facing the support substrate, the high acoustic impedance film having an acoustic impedance higher than an acoustic impedance of the piezoelectric layer;

the high acoustic impedance film includes the constraining layer; and the hollow portion overlaps at least a portion of the intersection region in plan view, and the high acoustic impedance film is in the hollow portion.

14. The acoustic wave device according to claim 1, wherein a low acoustic impedance material is in the hollow portion, and an acoustic impedance of the low acoustic impedance material is lower than an acoustic impedance of the piezoelectric layer.

15. The acoustic wave device according to claim 1, wherein a thickness of the piezoelectric layer is equal to or less than about $1\lambda$, where $\lambda$ is a wavelength defined by an electrode finger pitch of the IDT electrode.

16. The acoustic wave device according to claim 1, further comprising reflectors each provided on a respective end of the IDT electrode.

17. The acoustic wave device according to claim 1, wherein the acoustic wave device is a surface acoustic wave resonator.

18. The acoustic wave device according to claim 1, wherein the acoustic wave device is a filter device.

19. The acoustic wave device according to claim 1, wherein the acoustic wave device is a multiplexer.

20. The acoustic wave device according to claim 1, wherein the acoustic wave device is operable to generate a plate wave.

* * * * *